United States Patent
Maruyama et al.

(10) Patent No.: US 6,937,038 B2
(45) Date of Patent: Aug. 30, 2005

(54) CONTACTOR HAVING CONDUCTIVE PARTICLES IN A HOLE AS A CONTACT ELECTRODE

(75) Inventors: Shigeyuki Maruyama, Kawasaki (JP); Susumu Kida, Kawasaki (JP); Naoyuki Watanabe, Kawasaki (JP); Takafumi Hashitani, Kawasaki (JP); Ei Yano, Kawasaki (JP); Ichiro Midorikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 256 days.

(21) Appl. No.: 10/373,072

(22) Filed: Feb. 26, 2003

(65) Prior Publication Data

US 2003/0141884 A1 Jul. 31, 2003

Related U.S. Application Data

(62) Division of application No. 09/755,023, filed on Jan. 8, 2001, now Pat. No. 6,545,363.

(30) Foreign Application Priority Data

Jun. 26, 2000 (JP) ........................................ 2000-191405

(51) Int. Cl.$^7$ .............................................. G01R 31/02
(52) U.S. Cl. ...................................................... 324/754
(58) Field of Search ................................ 324/754, 756, 324/757, 758, 761, 158.1; 174/260, 263, 265; 438/666, 667; 257/773, 774, 780

(56) References Cited

U.S. PATENT DOCUMENTS

| | | | |
|---|---|---|---|
| 5,599,456 A | * | 2/1997 | Fanning ...................... 210/668 |
| 6,137,062 A | | 10/2000 | Zimmerman |
| 6,545,363 B2 | * | 4/2003 | Maruyama et al. ......... 257/773 |
| 2001/0011675 A1 | | 8/2001 | Hacke et al. |

* cited by examiner

Primary Examiner—Nestor Ramirez
Assistant Examiner—Trung Q. Nguyen

(57) ABSTRACT

A contactor is provided which contactor comprises an insulating substrate, a concave portion formed in the insulating substrate and extending in a perpendicular direction from a surface thereof, and elastic conductive particles disposed in the concave portion. A part of one of the conductive particles protrudes from the surface of the insulating substrate.

6 Claims, 13 Drawing Sheets

FIG. 2
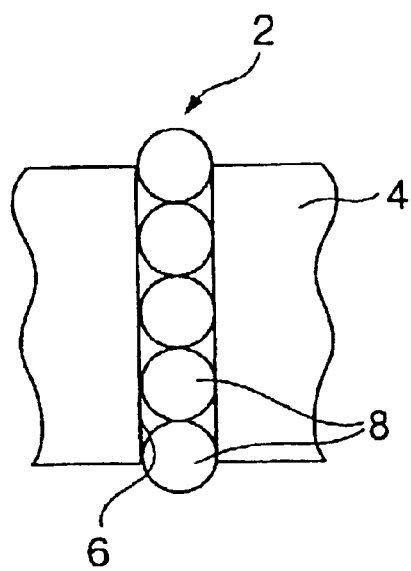
FIG. 3A    FIG. 3B
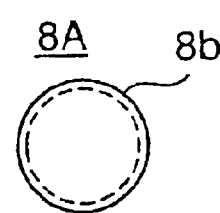
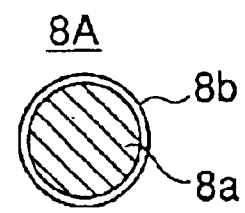

CONTACTOR HAVING CONDUCTIVE PARTICLES IN A HOLE AS A CONTACT ELECTRODE

This is a divisional of application Ser. No. 09/755,023, filed Jan. 8, 2001, now U.S. Pat. No. 6,545,363.

BACKGROUND OF THE INVENTION

1. Field of the Invention

The present invention generally relates to a contactor for electronic parts and, more particularly, to a contactor for electronic parts which contactor provides electrical conduction by contacting an electrode of a semiconductor device, such as an LSI circuit, to test the semiconductor device, and to a testing method using such a contactor.

Recently, a manufacturing technology of a semiconductor substrate and the like has been remarkably developed. Accordingly, a wiring pattern of a semiconductor device, such as an LSI circuit, has become finer, and terminals have been remarkably increased in number and miniaturized.

Also, miniaturization and high-density packaging are required for an electronic device using the semiconductor devices. For example, production and sales of mobile devices, such as a cellular phone, a mobile PC and a video camera, which are required to be small and of high performance are sharply increasing. Also, a need for a highly efficient computer having a minimum distance between adjacent LSI terminals to ensure a high-speed operation is increasing.

Therefore, more and more semiconductor devices such as the LSI circuit are shipped in the form of an unpackaged LSI chip with its function guaranteed. Such a shipping is referred to as a KGD (Known Good Die). Also, a number of shipping chip-size-packages (CSP), which are semiconductor devices packaged in the same size as the LSI chip, is sharply increasing.

In these circumstances, in order to conduct a test for the semiconductor devices such as the LSI circuit, a supply of a contactor capable of surely conducting electrically with a multitude of terminals formed as a part of the finer wiring pattern is becoming essential.

Also, from the viewpoint of efficiency in LSI tests, there is an ever-increasing need to conduct all of tests, such as an FT (Final Test) and a BI (Burn-In test), for a plurality of LSIs in the form of a wafer formed in an LSI manufacturing process.

A full test in the form of a wafer has an advantage of better handling efficiency than testing a separate LSI chip. That is, if each chip has a different size, a handling facility cannot be used commonly. However, in the form of a wafer, since the external shape of the wafers is standardized, the wafers can be conveyed all at once. There is also an advantage that information of inferior chips can be administered with a wafer map.

Further, for a wafer-level CSP which has recently been developed, even a packaging process can be controlled by the unit of a wafer. Therefore, if a test in the form of a wafer can be realized, LSI circuits can be treated in the form of a wafer from a wafer process through the packaging process to the tests. This makes the LSI manufacturing process efficient.

Hence, it is desired, as mentioned above, that a contactor capable of contacting a plurality of terminals of LSI circuits all at once be developed, the LSI circuits being in the form of wafer and having a multitude of miniaturized pins.

2. Description of the Related Art

Conventional contactors used for testing LSI circuits include: 1) a contactor using a mechanical probe of a needle type; 2) a contactor using a membrane probe; and 3) a contactor using an anisotropic conductive rubber.

1) A contactor using a mechanical probe of a needle type:

The contactor using a mechanical probe of a needle type is formed by placing each of needles (formed of such a material as a tungsten wire) at a position on a contactor substrate, the position corresponding to a terminal of an LSI circuit to be tested. Generally, each of the needles is slant from upright, extending toward the terminal of the LSI circuit. However, a method whereby each of the needles is placed upright has been developed.

2) A contactor using a membrane probe:

The contactor using a membrane probe is formed as a circuit substrate in the form of a film, the circuit substrate having a metal protrusion (referred to as a bump hereinafter) as a contact electrode for use as a stylus.

3) A contactor using an anisotropic conductive rubber:

The contactor using an anisotropic conductive rubber is formed of a rubber as an insulating member and a material (such as a metal wire) embedded therein, the material being conductive only in a thickness direction (perpendicular direction).

1) The contactor using a mechanical probe of a needle type has the following problems:

a) A manufacturing cost of the contactor is high, because the needles are formed one by one.

b) A location precision is subject to a limit, because the needles are individually mounted on the contactor substrate.

c) In a case of forming each of the needles to be slant, an arrangement of the needles is subject to a limit. Thus, it is difficult to manufacture the contactor capable of contacting a plurality of LSI circuits all at once.

2) The contactor using a membrane probe has the following problems:

a) Each of the contact electrodes cannot move freely. Since each of the contact electrodes is embedded in an insulating substrate, each of the contact electrodes can move only within a small range. Also, because the contact electrode is a metal bump, the contact electrode lacks flexibility. Therefore, when adjacent bumps have different heights, the lower bump does not contact the corresponding terminal or causes a poor connection.

b) Since the bump as a contact electrode is generally formed by laminating metal plating layers, manufacturing the bump takes a long time and the bump cost is high.

3) The contactor using an anisotropic conductive rubber has the following problems:

a) The contactor using an anisotropic conductive rubber has a short life duration. Especially, when used at a high temperature, the rubber part undergoes plastic deformation. Therefore, the contactor using an anisotropic conductive rubber can only be used 20 to 30 times at best and only once at worst.

b) Since it is difficult to embed the conductive materials with a fine pitch into the rubber, the contactor using an anisotropic conductive rubber cannot be used to test an LSI circuit having terminals with a fine pitch. This contactor can only be used to test an LSI circuit having terminals with approximately a 150 μm or greater pitch.

Further, in a case of using a contactor to test wafer-level LSI circuits all at once, a number of terminals of the LSI circuits sometimes totals several tens of thousands (100,000 terminals). Thus, the above-mentioned contactors commonly have the following problems.

I) A great pressure is required to press the contactor against the terminals of the LSI circuits.

With the above-mentioned conventional contactors, a pressure of 0.1 N (approximately 10 grams) a terminal is required. Therefore, in a case where a wafer has 100,000 terminals, a pressure of 10,000 N (approximately 1,000 kilograms) is required. With the conventional contactors, because of the different heights of the electrodes and other reasons, it is difficult to impose a pressure on all of the terminals uniformly. Thus, an excessive pressure is sometimes imposed on particular terminals. Additionally, without a facility that accepts all the pressure, there is a risk that the wafer may be broken or bent so that a circuit on the LSI chip is damaged.

II) Different coefficients of thermal expansion cause undesired shifting.

In most cases, a wafer for LSI circuits is made of silicon. A coefficient of linear expansion thereof is approximately 3 ppm. On the other hand, the insulating substrate of each of the above-mentioned contactors is formed of a resin or a rubber material, and a coefficient of linear expansion thereof is approximately 13–30 ppm. Therefore, even though the contactor accurately contacts the terminals of the LSI circuits at a normal temperature, when put at a high temperature as in the BI test, there is a risk that different coefficients of thermal expansion between the material forming the insulating substrate of the contactor and the silicon material of the wafer cause the contact electrode to shift so that the contact electrode is detached from the corresponding terminal of the LSI circuit or contacts an adjacent terminal. In a case where the insulating substrate of the contactor is formed of polyimide, a coefficient of thermal expansion of the polyimide is approximately 13 ppm. Thus, even though the contactor accurately contacts the terminals of the LSI circuits at a normal temperature, when heated to a temperature of 125° C., the contactor electrode is shifted from the corresponding terminal by as much as 100 μm around the outermost periphery, when using an 8-inch wafer (approximately 100 mm in diameter).

SUMMARY OF THE INVENTION

It is a general object of the present invention to provide an improved and useful contactor for testing electronic parts, in which contactor the above-mentioned problems are eliminated.

A more specific object of the present invention is to provide a contactor which has contact electrodes capable of undergoing large elastic deformation in a thickness direction (perpendicular direction) though formed with a narrow pitch and which contactor can contact all of the contact electrodes with terminals of semiconductor devices with a low pressure even when the contact electrodes have different heights.

In order to achieve the above-mentioned objects, there is provided according to one aspect of the present invention a contactor comprising:

an insulating substrate;

a concave portion formed in the insulating substrate and extending in a perpendicular direction from a surface thereof; and a plurality of conductive particles having elasticity and disposed in the concave portion, a part of one of the conductive particles protruding from the surface of the insulating substrate.

According to the present invention, the part of the conductive particle protruding from the surface of the insulating substrate functions as a contact electrode. A plurality of the conductive particles are disposed in the concave portion of the insulating substrate. Each of the conductive particles undergoes elastic deformation so as to produce a contact pressure of the contact electrode. Each of the conductive particles contacts and conducts with each other. Around the conductive particles in the concave portion is a space in which the conductive particles can deform.

Accordingly, each of the conductive particles can deform freely, and as a result, when a terminal of an object to be tested is pressed against the protruding conductive particle so that the protruding part thereof becomes flat, each of the conductive particles can deform while maintaining a considerably low pressure. Therefore, even in a case of a multitude of terminals as in a wafer-level semiconductor device test, a low pressure can provide a sure contact.

Additionally, in the contactor according to the present invention, the concave portion may be formed as a through hole penetrating through the insulating substrate in the perpendicular direction, and parts of the conductive particles on both ends of the through hole protrude from both surfaces of the insulating substrate, respectively.

According to the present invention, by aligning the conductive particles in the through hole and arranging the conductive particles on both ends to protrude from both surfaces of the insulating substrate, the contactor having the contact electrodes on both surfaces of the insulating substrate can be achieved. This structure is very simple and thus can be manufactured at a low cost.

Additionally, in the contactor according to the present invention, the concave portion may be formed as a through hole penetrating through the insulating substrate in the perpendicular direction, and a terminal for circuit wiring closes one end of the through hole.

According to the present invention, since the terminal for circuit wiring is formed on one end of the through hole, a column of the conductive particles electrically connects a tip of the contact electrode and the terminal for circuit wiring. In addition, since the conductive particles produce a contact pressure, the contact electrode can have a very simple structure.

In order to achieve the above-mentioned objects, there is also provided according to another aspect of the present invention a contactor comprising:

an insulating substrate;

a concave portion formed in the insulating substrate and extending in a perpendicular direction from a surface thereof;

a conductive liquid filling the concave portion; and a conductive particle disposed in the concave portion and having a specific gravity different from a specific gravity of the conductive liquid, wherein a difference between the specific gravity of the conductive particle and the specific gravity of the conductive liquid causes a part of the conductive particle to protrude from a surface of the insulating substrate.

Additionally, in the contactor according to the present invention, the specific gravity of the conductive particle may be smaller than the specific gravity of the conductive liquid so that a buoyancy acting on the conductive particle causes the conductive particle to protrude from the insulating substrate.

Additionally, in the contactor according to the present invention, the specific gravity of the conductive particle may be higher than the specific gravity of the conductive liquid so that a gravity force acting on the conductive particle causes the conductive particle to protrude from the insulating substrate.

According to the present invention, a difference in specific gravities between the conductive particle and the conductive liquid causes a buoyancy or a gravity force, and thus produces a contact pressure. Therefore, such a simple structure as this can provide an extremely low contact pressure.

In order to achieve the above-mentioned objects, there is also provided according to another aspect of the present invention a contactor comprising:

an insulating substrate;

a concave portion formed in the insulating substrate and extending in a perpendicular direction from a surface thereof;

a plurality of conductive particles disposed in the concave portion, the conductive particles being aligned with each other in a direction in which the concave portion extends, and being contacted with each other;

an insulating film formed on the surface of the insulating substrate; and a conductive portion formed at a position of the insulating film corresponding to an opening of the concave portion, wherein a coefficient of linear expansion of each of the conductive particles is larger than a coefficient of linear expansion of the insulating substrate, and when the contactor is heated, each of the conductive particles undergoes thermal expansion so that the conductive portion protrudes by being pressed by the conductive particles.

According to the present invention, the conductive particles undergo thermal expansion at an operating temperature so that the conductive portion formed in the insulating film protrudes. This protruding conductive portion can be used as the contact electrode.

In order to achieve the above-mentioned objects, there is also provided according to another aspect of the present invention a contactor comprising:

an insulating substrate;

a concave portion formed in the insulating substrate and extending in a perpendicular direction from a surface thereof;

a conductive liquid filling the concave portion;

a conductive particle mixed in the conductive liquid;

an insulating film formed on the surface of the insulating substrate; and a conductive portion formed at a position of the insulating film corresponding to an opening of the concave portion, wherein, when the contactor is heated, the conductive particle mixed in the conductive liquid undergoes thermal expansion so that the conductive portion protrudes by being pressed by the conductive particle mixed in the conductive liquid.

According to the present invention, a mixture of the conductive particle and the conductive liquid undergoes a larger thermal expansion than an increase in volume of the concave portion caused by thermal expansion of the insulating substrate. Therefore, in a case of conducting a test at a heated temperature, the thermal expansion of the mixture causes the conductive portion of the insulating film to protrude. This protrusion enables a proper contact.

In order to achieve the above-mentioned objects, there is also provided according to another aspect of the present invention a test method using a contactor comprising an insulating substrate; a concave portion formed in the insulating substrate and extending in a perpendicular direction from a surface thereof; and a plurality of conductive particles having elasticity and disposed in the concave portion, a part of one of the conductive particles protruding from the surface of the insulating substrate, the method comprising the steps of:

placing an object to be tested opposite to the contactor so that an external connection terminal of the object to be tested is aligned with the part of one of the conductive particles protruding from the surface of the insulating substrate; and pressing the contactor against the object to be tested so that a surface of the object to be tested contacts the surface of the insulating substrate with a predetermined low pressure.

According to the present invention, simply pressing the contactor against the object to be tested can have the contactor contact the object to be tested with a proper contact pressure. Since each of the conductive particles can undergo elastic deformation easily, an extremely low contact pressure can be achieved. For example, when the contactor is used in testing a semiconductor device in the form of a wafer, a low pressure can provide a sure contact.

In order to achieve the above-mentioned objects, there is also provided according to another aspect of the present invention a test method using a contactor comprising an insulating substrate; a concave portion formed as a through hole penetrating through the insulating substrate in a perpendicular direction; and a plurality of conductive particles having elasticity and disposed in the concave portion, parts of the conductive particles on both ends of the through hole protruding from both surfaces of the insulating substrate, respectively, the method comprising the steps of:

placing a test substrate opposite to one surface of the contactor so that a connection terminal of the test substrate contacts a part of the conductive particles at one end of the through hole protruding from one surface of the insulating substrate;

placing an object to be tested opposite to the other surface of the contactor so that an external connection terminal of the object to be tested contacts a part of the conductive particles at the other end of the through hole protruding from the other surface of the insulating substrate; and pressing the test substrate and the object to be tested against the contactor with a predetermined low pressure so that the test substrate and the object to be tested contact the contactor and electrically connect to each other.

According to the present invention, simply placing the contactor between the test substrate and the object to be tested and pressing the test substrate and the object to be tested against the contactor can achieve a sure contact with a low contact pressure.

In order to achieve the above-mentioned objects, there is also provided according to another aspect of the present invention a contactor comprising:

an insulating substrate;

a concave portion formed in the insulating substrate and extending in a perpendicular direction from a surface thereof; and a conductor disposed in the concave portion, the conductor being in either a liquid phase or an intermediate phase between a liquid phase and a solid phase at an operating temperature, wherein a part of the conductor protrudes from the surface of the insulating substrate, the part formed as a protrusion.

According to the present invention, since the conductor comes in either a liquid phase or an intermediate phase between a liquid phase and a solid phase at an operating temperature, a very low pressure can deform the conductor. Therefore, when using the protrusion of the conductor as the contact electrode, an electrical contact with a substantially zero contact pressure can be achieved.

In order to achieve the above-mentioned objects, there is also provided according to another aspect of the present invention a test method using a contactor comprising an insulating substrate; a concave portion formed in the insulating substrate and extending in a perpendicular direction from a surface thereof; and a conductor disposed in the concave portion, the conductor being in either a liquid phase or an intermediate phase between a liquid phase and a solid phase at an operating temperature, in which contactor a part of the conductor protrudes from the surface of the insulating substrate, the part formed as a protrusion, the method comprising the steps of:

placing an object to be tested opposite to the contactor so that an external connection terminal of the object to be tested is aligned with the protrusion; and pressing the contactor against the object to be tested so that a surface of the object to be tested contacts the surface of the insulating substrate with a predetermined low pressure.

According to the present invention, simply having the contactor adjoin the object to be tested can have the contactor contact the object to be tested with substantially no pressure. Therefore, when the contactor is used in testing a semiconductor device in the form of a wafer, a low pressure can provide a sure contact.

Other objects, features and advantages of the present invention will become more apparent from the following detailed description when read in conjunction with the accompanying drawings.

BRIEF DESCRIPTION OF THE DRAWINGS

FIG. 2 is a cross-sectional view of each of contact electrodes of the contactor shown in FIG. 1;

FIG. 3A is an elevational view of an example of a ball shown in FIG. 2;

FIG. 3B is a cross-sectional view of the ball shown in FIG. 3A;

DETAILED DESCRIPTION OF THE PREFERRED EMBODIMENTS

A description will now be given, with reference to FIG. 1 to FIG. 8, of a first embodiment according to the present invention.

Figure 1:
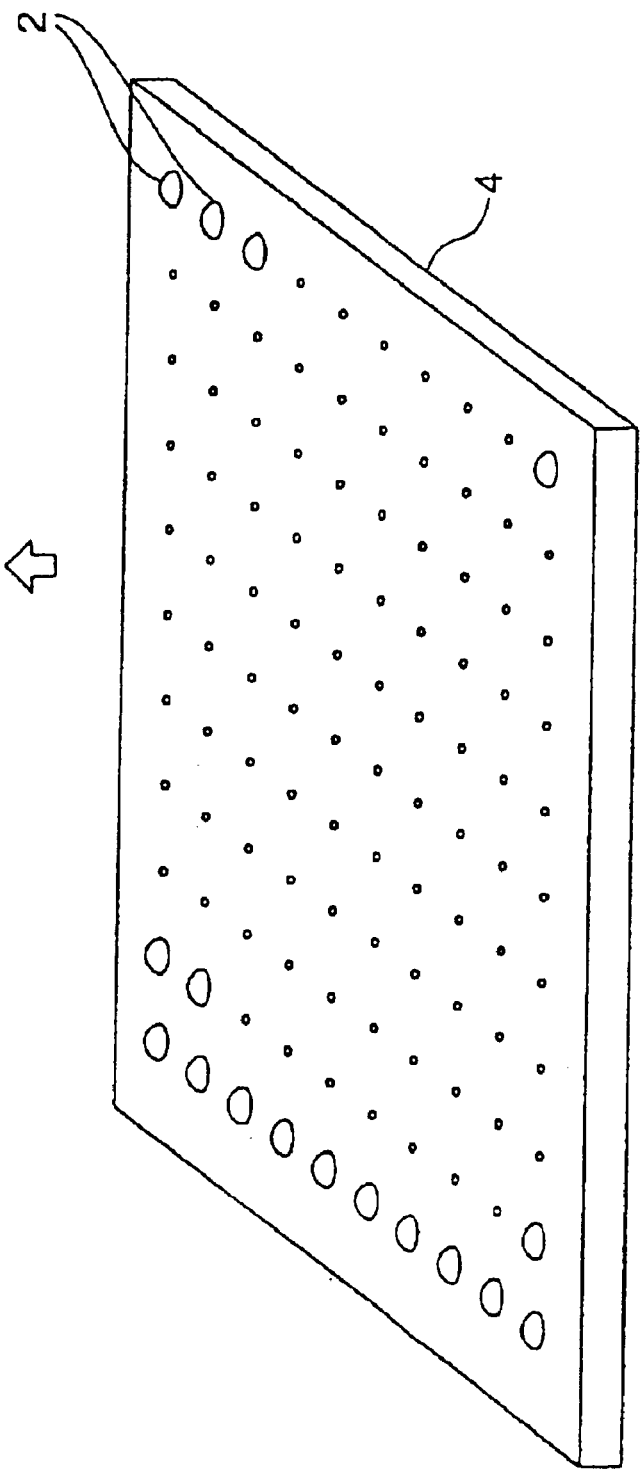
FIG. 1 is a perspective view of a contactor according to a first embodiment of the present invention.

FIG. 1 is a perspective view of a contactor according to the first embodiment of the present invention. The contactor shown in FIG. 1 is used for testing at one time a plurality of semiconductor devices formed on a wafer and comprises contact electrodes 2 to be put into contact with terminals of the semiconductor devices.

The contactor shown in FIG. 1 further comprises an insulating substrate 4 to hold the contact electrodes 2. That is, a multitude of the contact electrodes 2 are formed in the insulating substrate 4. The contact electrodes 2 are disposed in the same arrangement (or with the same pitch) as the terminals of the semiconductor devices to be tested. Therefore, when the contactor is placed on the semiconductor devices, electrical contact therebetween is secured by aligning the locations of the terminals of the semiconductor devices with the locations of the contact electrodes of the contactor.

FIG. 2 is a cross-sectional view of each of the contact electrodes 2 of the contactor shown in FIG. 1. The contact electrode 2 comprises a through hole 6 formed in the insulating substrate 4 and a plurality of balls 8 disposed in the through hole 6. The through holes 6 are formed in the same arrangement as the terminals of the semiconductor devices to be tested.

Each of the balls 8 disposed in the through hole 6 is made of a substantially spherical, properly elastic, conductive particle. For example, the ball 8 may be formed of a particle of conductive rubber.

Each of the balls 8 has a diameter substantially equal to an inner diameter of the through hole 6 and is aligned and contacted with other balls 8 in the through hole 6. A number of the balls 8 disposed in the through hole 6 is determined so that parts of the balls 8 protrude from both surfaces of the insulating substrate 4. That is, a part of a ball 8 on one end protrudes from one surface of the insulating substrate 4, and a part of another ball 8 on the other end protrudes from the other surface of the insulating substrate 4.

When pressures are imposed from both ends of a column of the balls 8, the balls 8 are pressed against one another and undergo elastic deformation so that the adjacent balls 8 conduct electrically. Thus, the ball 8 on one end of the column conducts electrically with the ball 8 on the other end of the column.

That is, contacting the ball 8 on one end of the column with the terminal of the semiconductor device, contacting the ball 8 on the other end with an electrode of a test board and imposing the proper pressures can connect the terminal of the semiconductor device and the electrode of the test board, providing a role of a contactor. Pressing the terminal of the semiconductor device until the terminal contacts the one-surface of the insulating substrate 4 and pressing the electrode of the test board until the electrode contacts the other surface of the insulating substrate 4 can impose the proper pressures.

According to the above-mentioned contact electrode 2, the spherical balls 8 provide a space between the adjacent balls 8 to allow each of the balls 8 to deform in the through hole 6. Accordingly, each of the balls 8 can undergo elastic deformation in the through hole 6, occupying this space, so as to secure a contact pressure between the balls 8 and a contact pressure between each of the balls 8 on the ends and the corresponding terminal or electrode.

FIG. 3A is an elevational view of a ball 8A as an example of the ball 8. FIG. 3B is a cross-sectional view of the ball 8A. The ball 8A shown in FIG. 3A and FIG. 3B comprises a core 8a, an elastic material such as rubber, and a conductive material layer 8b, such as a nickel plating layer, formed on the surface of the core 8a. The conductive material layer 8b may be formed of the nickel plating layer and a gold plating layer further thereon.

According to the ball 8A shown in FIG. 3A and FIG. 3B, the conductive material layer 8b formed on the surface secures electrical conductivity, and the core 8a secures elasticity. Accordingly, varying the material of the core 8a can change the coefficient of elastic deformation of the ball 8 and consequently adjust a contact pressure that the contact electrode 2 provides.

Figures 4A, 4B:
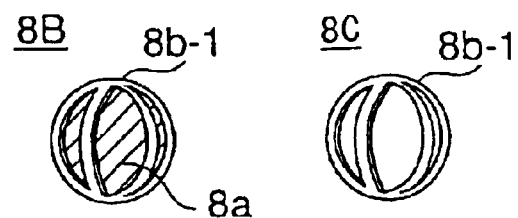
FIG. 4A is an elevational view of a variation of the ball shown in FIG. 2.
FIG. 4B is an elevational view of another variation of the ball shown in FIG. 2.

FIG. 4A is an elevational view of a ball 8B as a variation of the ball 8A shown in FIG. 3A and FIG. 3B. As shown in FIG. 4A, the ball 8B may comprise a partially formed conductive material layer 8b-1. A coefficient of elastic deformation of the ball 8A shown in FIG. 3A and FIG. 3B is a resultant of a coefficient of elastic deformation of the core 8a and a coefficient of elastic deformation of the conductive material layer 8b. However, a coefficient of elastic deformation of the ball 8B shown in FIG. 4A relies more on the coefficient of elastic deformation of the core 8a.

Further, as shown in FIG. 4B, the core 8a of the ball 8B may be removed, leaving the partially formed conductive material layer 8b-1 alone for a ball 8C. In this case, the ball 8C is a hollow sphere, and the conductive material layer 8b-1 alone provides a coefficient of elastic deformation of the ball 8C. Accordingly, a ball with a small coefficient of elastic deformation can be formed.

In the above-mentioned embodiment, the ball 8 as a conductive particle is stuffed into the through hole 6 to be held therein. However, some measure may be implemented to prevent the ball 8 from falling out of the through hole 6.

Figure 5:
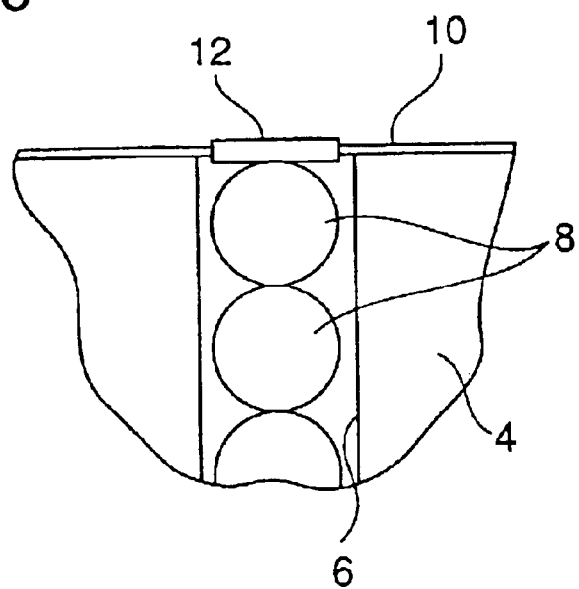
FIG. 5 is a cross-sectional view of an example where an opening of a through hole is covered with a film.

FIG. 5 is a cross-sectional view of an example where the ball 8 is held in the through hole 6 by applying a film 10 on a surface of the insulating substrate 4 and covering an opening of the through hole 6 with the film 10. An insulating polyimide (PI) film can be used as the film 10. However, a conductive material 12 is formed in the polyimide film at a position corresponding to the opening of the through hole 6 so that the ball 8 conducts externally.

Before applying the film 10 on the insulating substrate 4, a predetermined number of the balls 8 are stuffed into the through hole 6. Thereafter, the film 10 is applied on the insulating substrate 4 so that the conductive material 12 of the film 10 is placed at the position corresponding to the opening of the through hole 6.

When applying the film 10 on the insulating substrate 4, while the pressure of the film 10 deforms the ball 8, the elasticity of the ball 8 curves the film 10 so that, at the position corresponding to the ball 8, the conductive material 12 protrudes. Although FIG. 5 shows the conductive material 12 as a flat surface, the conductive material 12 actually protrudes a little toward the opposite side of the ball 8. Therefore, the ball 8 electrically conducts with the terminal of the semiconductor device to be tested or the electrode of the test board through the conductive material 12.

Figure 6:
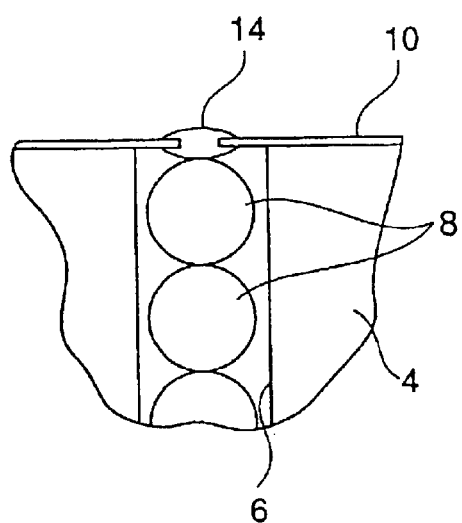
FIG. 6 is a cross-sectional view of an example where a bump is formed in the film covering the opening of the through hole.

FIG. 6 is a cross-sectional view of an example where a bump 14 is formed in the film 10 in place of the conductive material 12. The bump 14 is formed of a conductive material having a shape curved toward both the inner and outer surfaces of the film 10. The bump 14 provides the same effect as the above-mentioned conductive material 12. Further, the bump 14, protruding more due to its curved shape, achieves a sure contact.

Figure 7:
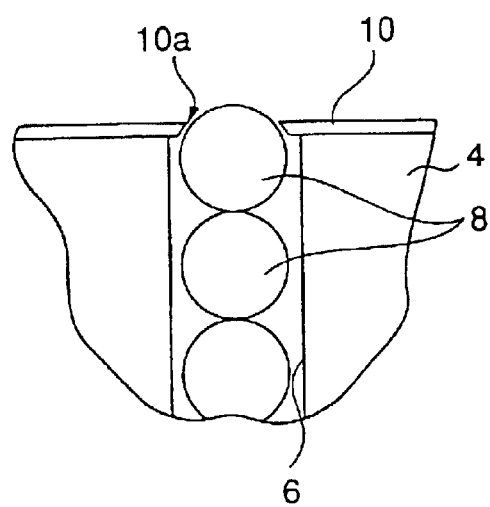
FIG. 7 is a cross-sectional view of an example where an opening, smaller in diameter than the ball, is formed in the film covering the opening of the through hole.

FIG. 7 is a cross-sectional view of an example where an opening 10a, smaller in diameter than the ball 8, is formed in the film 10 in place of the conductive material 12 or the bump 14. With this structure, when applying the film 10 on the insulating substrate 4, a part of the ball 8 protrudes from the opening 10a. However, since the inner diameter of the opening 10a is smaller than the diameter of the ball 8, the ball 8 is held in the through hole 6.

Figure 8:
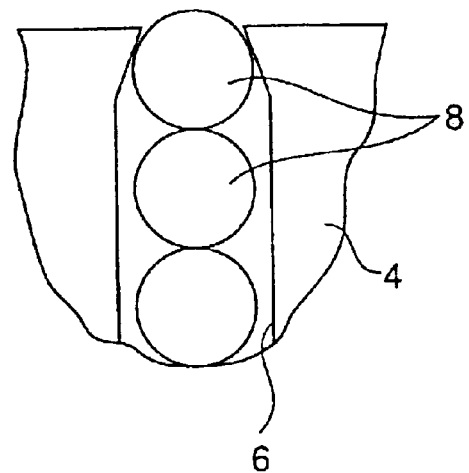
FIG. 8 is a cross-sectional view of an example where the through hole is tapered toward one end so that the opening thereof is smaller in diameter than the ball.

FIG. 8 is a cross-sectional view of an example where the through hole 6 is tapered toward one end so that the opening thereof is smaller in diameter than the ball 8. As with the above-mentioned structure shown in FIG. 7, a part of the ball 8 protrudes from the opening of the through hole 6. However, since the inner diameter of the opening is smaller than the diameter of the ball 8, the ball 8 is held in the through hole 6.

The contactor according to the present embodiment may be used as a contactor for a wafer-level CSP (LGA type) having pad terminals, for example, with a 500-μm pitch. As an LSI circuit to be tested, a plurality of 10-mm-square LSI chips in the form of a wafer, each LSI chip having approximately 360 terminals, may be expected. In a case of using an 8-inch wafer, the wafer has approximately 250 LSI chips and 90,000 terminals in total.

A 500-μm-thick silicon wafer may be used as the insulating substrate 4 of the contactor. The through holes 6, each having a diameter of 150 μm, are formed in this silicon wafer with a 500-μm pitch. Then, five to six or more hollow balls 8C shown in FIG. 4B, each formed approximately 100 to 120 μm in diameter, are stuffed into each of the through holes 6.

Since the hollow balls 8C easily undergo elastic deformation, an average pressure of 0.02 to 4 N a terminal provides a sure contact.

Additionally, the contactor according to the present embodiment may have a structure applicable to bare chips. In a case of a contactor for area array chips, a 500-μm-thick silicon substrate is used as the insulating substrate 4 of the contactor, as in the above-mentioned example. In this example, the through holes 6, each having a diameter of 100 μm, are formed in the insulating substrate 4 with a 200-μm pitch in a matrix. Then, seven or more particles, each having a diameter of approximately 80 μm, are stuffed into each of the through holes 6 so as to form the contact electrode 2. In this case, a pressure required for a sure contact is substantially equal to that of the above-mentioned contactor for the LGA.

In the above-mentioned embodiment, the conductive particles are disposed in a column in the through hole 6. Therefore, it is preferred that the inner diameter of the through hole 6 be substantially equal to the diameter of the conductive particle. It is also preferred that five to six conductive particles be disposed in the through hole 6 so as to, when pressing the conductive particles, curb a repulsion thereof to a small degree and to prevent each of the conductive particles from deforming beyond a range of elastic deformation. To achieve this structure, an aspect ratio (length to inner diameter) of the through hole 6 is preferred to be large. That is, the aspect ratio of the through hole 6 is preferred to be five to six or more. This structure of the through hole 6 is commonly applicable to embodiments to be described hereinafter.

Additionally, in the above-mentioned embodiment, the through hole 6 is depicted as penetrating through the insulating substrate 4 in a perpendicular direction thereof. However, in a structure where only the conductive particle on one end protrudes from one surface of the insulating substrate 4, the through hole 6 only has to be a concave portion which extends into the insulating substrate 4 in a perpendicular direction thereof. For example, when the other end of the through hole 6 is capped with an external connection terminal, the through hole 6 may be recognized as the concave portion.

Next, a description will be given, with reference to FIG. 9, FIG. 10A and FIG. 10B, of a second embodiment according to the present invention. A contactor according to the present embodiment has the same structure as the above-mentioned contactor according to the first embodiment except for a shape of the ball 8. That is, the contactor according to the second embodiment comprises non-spherical particles stuffed into the through hole.

Figure 9:
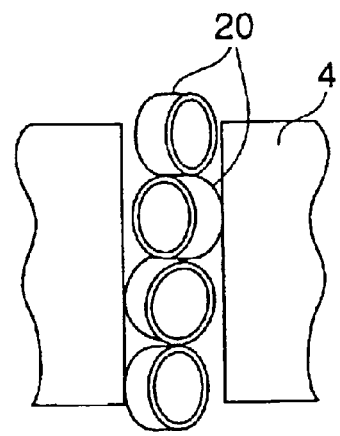
FIG. 9 is a cross-sectional view of an example of a contact electrode formed in a contactor according to a second embodiment of the present invention.

FIG. 9 is a cross-sectional view of an example of a contact electrode formed in the contactor according to the second embodiment of the present invention. In the example shown in FIG. 9, a cylindrical conductor 20 is stuffed into the through hole 6 instead of the ball 8.

The conductor 20 is a hollow cylindrical conductive material cut into a ring. The conductor 20 is disposed so that an axis of the cylindrical shape thereof aligns with a diametrical direction of the through hole 6. That is, since the conductor 20 is flexible to a force put in a direction perpendicular to the axis of the cylindrical shape thereof, the conductor 20 is disposed so as to deform easily in a direction in which the through hole 6 extends. Additionally, the conductor 20 may be composed of a cylindrical insulating and elastic material with a conductive material layer formed on a peripheral surface thereof.

Figure 10A:
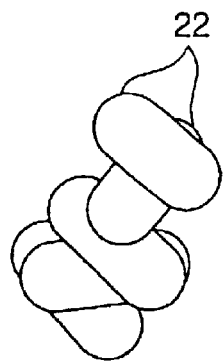
FIG. 10A is a perspective view of an arrangement of particles of another example of the contact electrode formed in the contactor according to the second embodiment of the present invention.

FIG. 10A is a perspective view of an arrangement of particles of another example of the contact electrode formed in the contactor according to the second embodiment of the present invention. FIG. 10B is a cross-sectional view of the contact electrode.

Figure 10B:
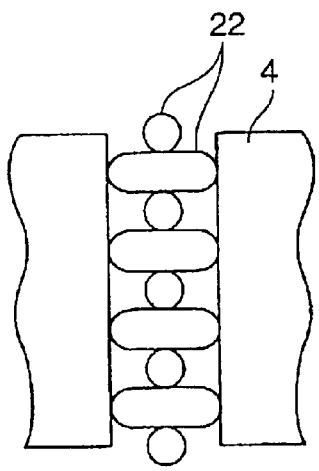
FIG. 10B is a cross-sectional view of the contact electrode shown in FIG. 10A.

The contact electrode shown in FIG. 10A and FIG. 10B uses an ellipsoid capsule 22 as a particle composing the contact electrode. The ellipsoid capsule 22 may have a conductive material layer formed only on a surface thereof or be hollow, as with the balls 8A, 8B and 8C in the above-mentioned first embodiment.

The contact electrodes shown in FIG. 9, FIG. 10A and FIG. 10B provide a large space in the through hole 6 so that the particle (conductor 20 or capsule 22) disposed in the through hole 6 deforms in the space. This prevents an inner surface of the through hole 6 from blocking the deformation of the particle.

Additionally, in the contactor according to the present embodiment, the through hole 6 may be covered with a film so that the particle is held in the through hole 6, as in the contactor according to the first embodiment.

Figure 11:
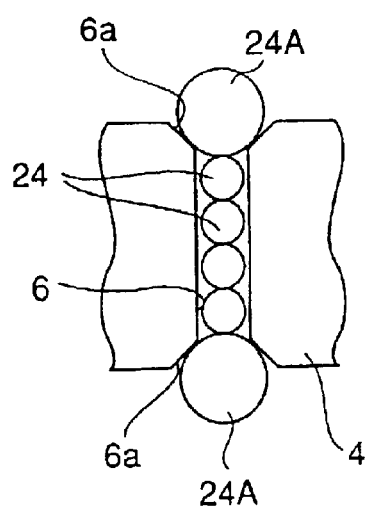
FIG. 11 is a cross-sectional view of a contact electrode of an example of a contactor according to a third embodiment of the present invention.
Figure 12:
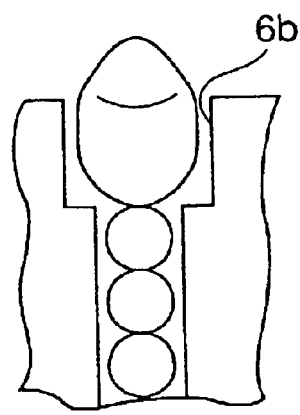
FIG. 12 is a cross-sectional view of a contact electrode of another example of the contactor according to the third embodiment of the present invention.

Next, a description will be given, with reference to FIG. 11 and FIG. 12, of a third embodiment according to the present invention. FIG. 11 is a cross-sectional view of a contact electrode of an example of a contactor according to the third embodiment of the present invention. FIG. 12 is a cross-sectional view of a contact electrode of another example of the contactor according to the third embodiment of the present invention. In the contactor according to the present embodiment, a contact electrode comprises particles of different sizes disposed in the through hole 6. Except for this point, the contactor according to the present embodiment has the same structure as the above-mentioned contactor according to the first embodiment.

As shown in FIG. 11, chamfers 6a are formed on both ends of the through hole 6. Each of particles (balls) 24A disposed on both ends is larger in diameter than a particle 24 disposed in between. This structure allows a larger portion of the ball 24A to protrude from the insulating substrate 4. This is effective when forming a film on a surface of the insulating substrate 4 to hold the balls 24A in the through hole 6.

As shown in FIG. 12, a large opening 6b is formed on one end of the through hole 6. An ellipsoid capsule as shown in FIG. 10A and FIG. 10B is disposed longitudinally in the large opening 6b. This structure allows an even larger portion of the particle to protrude from the insulating substrate.

Additionally, in the contactor according to the present embodiment, the through hole 6 may be covered with a film so that the particle is held in the through hole 6, as with the contactor according to the first embodiment.

Figure 13:
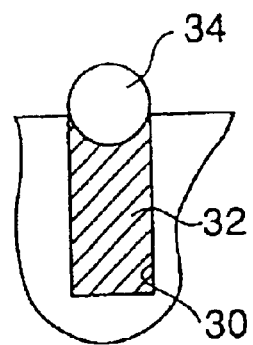
FIG. 13 is a cross-sectional view of a contact electrode formed in a contactor according to a fourth embodiment of the present invention.

Next, a description will be given, with reference to FIG. 13 to FIG. 15, of a fourth embodiment according to the present invention. FIG. 13 is a cross-sectional view of a contact electrode formed in a contactor according to the fourth embodiment of the present invention.

In the contactor according to the present embodiment, a contact electrode is formed in the insulating substrate 4 and comprises not the through hole 6 but a hole 30. The hole 30 has an opening on one end at a surface of the insulating substrate 4 and is closed at the other end. The hole 30 is filled with a conductive liquid 32. A conductive particle (ball) 34 having a specific gravity lower than that of the liquid 32 is floated on a surface of the liquid 32 in the hole 30 so that a part of the conductive particle 34 protrudes from the surface of the insulating substrate 4.

The following can be used as the liquid 32 filling the hole 30:

a) gallium (Ga), a semi-molten metal which is substantially a liquid at normal temperature (melting point: 29.8° C.);

b) an alloy containing 92% gallium (Ga) and 8% tin (Sn) (in a liquid phase at 20° C.);

c) mercury (Hg) (in a liquid phase at normal temperature); or d) an alloy containing mercury.

As the conductive particle 34, a material having a specific gravity lower than that of the liquid 32 can be used so as to float on the surface of the liquid 32. The material having a specific gravity lower than that of the liquid 32 includes such a metal as aluminum. Also, a ball as shown in FIG. 3A and FIG. 3B comprising a rubber core and a conductive layer formed on the surface thereof may be used as the conductive particle 34. Also, a hollow ball without a core as shown in FIG. 4B may be used as the conductive particle 34.

It should be noted that the conductive particle 34 according to the present embodiment does not need to have elasticity itself, because a contact pressure is provided as a buoyancy of the conductive particle 34 in the liquid 32. Therefore, a low contact pressure can easily be achieved.

Figure 14A:
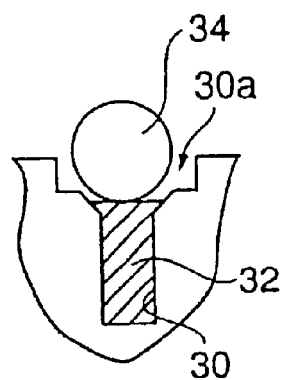
FIG. 14A is a cross-sectional view of a variation of the contact electrode shown in FIG. 13.
Figure 14B:
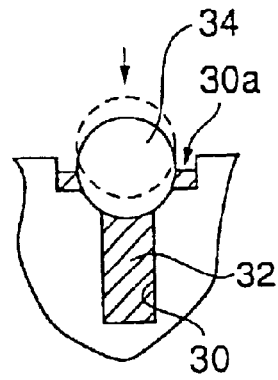
FIG. 14B is a cross-sectional view of the contact electrode shown in FIG. 14A when a conductive particle is pressed into a liquid.

FIG. 14A and FIG. 14B are cross-sectional views of a variation of the contact electrode shown in FIG. 13. The variation shown in FIG. 14A comprises a liquid storing portion 30a. When a pressure forces the conductive particle 34 to sink into the liquid 32, as shown in FIG. 14B, the liquid 32 can move to the liquid storing portion 30a. A contact electrode having this structure provides a contact pressure equal to a buoyancy of the conductive particle 34, and thus a contactor which provides a considerably low contact pressure can be achieved. In addition, since the liquid 32 moves to the liquid storing portion 30a so as to reduce an elevation of the level (height) of the liquid 32, the buoyancy of the conductive particle 34 can be kept small.

Additionally, since this structure does not comprise any mechanically moving parts, a contactor suitable for repeated use can be easily achieved. Hence, a contactor which can provide a sure contact with a contact pressure of 0.01 N a terminal (0.1 g a terminal), for example, can be easily manufactured.

In the above-mentioned contact electrodes, the conductive particle 34 is floated on the surface of the liquid 32. However, the conductive particle 34 may be submerged down to the bottom of the hole 30 by arranging a specific gravity of the conductive particle 34 to be higher than that of the liquid 32. In this case, the bottom of the hole 30 is covered with such a material as the above-mentioned insulating film 10 having the conductive material 12, and the conductive material protrudes, being pushed by a weight of the conductive particle 34 (actually a weight given by deducting the buoyancy of the conductive particle 34 from the weight thereof).

Figure 15:
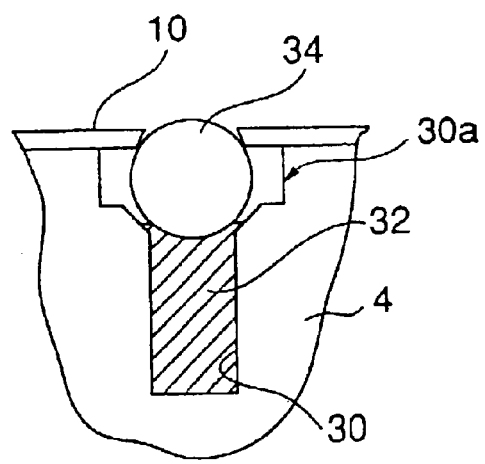
FIG. 15 is a cross-sectional view of a structure where the film shown in FIG. 7 is provided for the contact electrode shown in FIG. 14A and FIG. 14B.

FIG. 15 is a cross-sectional view of a structure where the film 10 shown in FIG. 7 is provided for the contact electrode shown in FIG. 14A and FIG. 14B. An opening smaller in diameter than the conductive particle 34 is formed in the film 10 so that the conductive particle 34 is held in the hole 30.

Figure 16A:
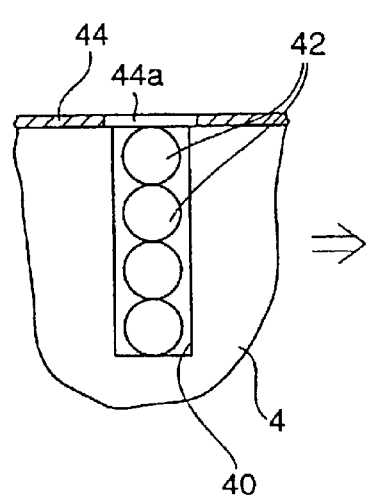
FIG. 16A is a cross-sectional view of a contact electrode of a contactor according to a fifth embodiment of the present invention.
Figure 16B:
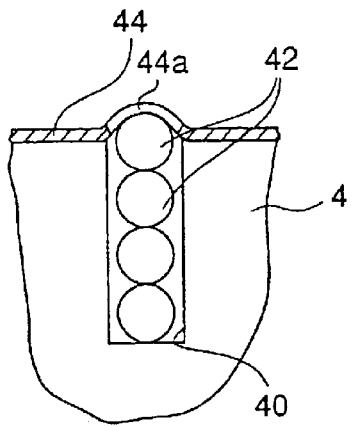
FIG. 16B is a cross-sectional view of the contact electrode shown in FIG. 16A when heated to a high temperature.

Next, a description will be given, with reference to FIG. 16A and FIG. 16B, of a fifth embodiment according to the present invention. FIG. 16A is a cross-sectional view of a contact electrode of a contactor according to the fifth embodiment of the present invention. FIG. 16B is a cross-sectional view of the contact electrode shown in FIG. 16A when heated to a high temperature.

The contact electrode according to the present embodiment comprises a hole 40 formed in the insulating substrate 4. The hole 40 has an opening on one end at a surface of the insulating substrate 4 and is closed at the other end. The hole 40 contains a plurality of conductive particles 42. The opening of the hole 40 is covered with a film 44. A portion corresponding to the opening of the hole 40 in the film 44 is formed as a conductive portion 44a.

The conductive particle 42 has an electrical conductivity and is formed of a material having a larger coefficient of linear expansion than that of a material (such as silicon) composing the insulating substrate 4. A depth of the hole 40 and a number of the conductive particles 42 disposed therein are determined so that one of the conductive particles 42 contacts the conductive portion 44a of the film 44 and that the film 44 is flat.

With the above-mentioned contact electrode, when the contactor is heated from a normal temperature to a high temperature of, for example, 125° C., thermal expansion of the conductive particles 42 causes the portion of the film 44 corresponding to the hole 40 to protrude. That is, in a case where the insulating substrate 4 is formed of a 500-μm-thick silicon substrate and each of the conductive particles 42 is formed of rubber, the difference in coefficients of linear expansion therebetween is approximately 100 ppm. This difference in thermal expansion causes the conductive particles 42 to expand more than the insulating substrate 4 formed of silicon. As a result, the conductive particles 42 push up the portion in the film 44 corresponding to the hole 40 so as to protrude.

FIG. 16A is a cross-sectional view of the above-mentioned contact electrode at a normal temperature (room temperature). In FIG. 16A, the film 44 is flat. When the contactor is heated from the normal temperature to a high temperature of approximately 125° C., the conductive particles 42 expand more than the insulating substrate 4 as shown in FIG. 16B, and as a result, the conductive portion 44a of the film 44 protrudes. Accordingly, aligning the conductive portion 44a with, for example, a terminal of a semiconductor device, at a normal temperature, and then placing the contactor under a high-temperature condition causes thermal expansion of the conductive particles 42 so as to generate a pressure which presses the conductive portion 44a against the terminal. This provides a proper contact pressure. In this case, changing a coefficient of linear expansion of the conductive particle 42 enables adjustment of the contact pressure.

Figure 17A:
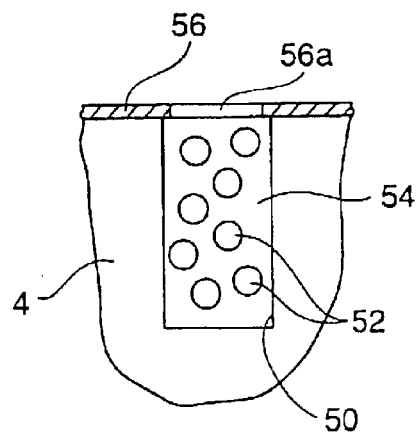
FIG. 17A is a cross-sectional view of a contact electrode of a contactor according to a sixth embodiment of the present invention.
Figure 17B:
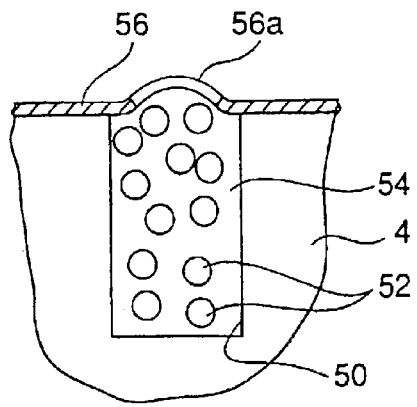
FIG. 17B is a cross-sectional view of the contact electrode shown in FIG. 17A when heated to a high temperature.

Next, a description will be given, with reference to FIG. 17A to FIG. 22, of a sixth embodiment according to the present invention. FIG. 17A is a cross-sectional view of a contact electrode of a contactor according to the sixth embodiment of the present invention. FIG. 17B is a cross-sectional view of the contact electrode shown in FIG. 17A when heated to a high temperature.

The contact electrode according to the present embodiment comprises a hole 50 formed in the insulating substrate 4. The hole 50 has an opening on one end at a surface of the insulating substrate 4 and is closed at the other end. The hole 50 is filled with a conductive liquid 54 mixed with particles 52 formed of a material having a large coefficient of linear expansion. The opening of the hole 50 is covered with a film 56. A portion corresponding to the opening of the hole 50 of the film 56 is formed as a conductive portion 56a.

The conductive liquid 54 is a liquid at normal temperature and electrically conductive, as with gallium (Ga), mercury (Hg) and the like. The conductive liquid 54 fills up the entire hole 50 so as to contact the conductive portion 56a of the film 56. Although it does not matter whether the particle 52 is electrically conductive or not, the particle 52 must have a larger coefficient of linear expansion than that of the insulating substrate 4.

With the above-mentioned contact electrode, when the contactor is heated from a normal temperature to a high temperature of, for example, 125° C., thermal expansion of the conductive particles 52 causes the portion of the film 56 corresponding to the hole 50 to protrude. That is, when each of the particles 52 mixed with the conductive liquid 54 undergoes thermal expansion, a volume of the conductive liquid 54 increases as a whole. Although a volume of the hole 50 also increases by thermal expansion of the insulating substrate 4, since the particle 52 has a larger coefficient of linear expansion than that of the insulating substrate 4, the increase in the volume of the conductive liquid 54 as a whole pushes up the film 56 so as to protrude.

FIG. 17A is a cross-sectional view of the above-mentioned contact electrode at a normal temperature (room temperature). In FIG. 17A, the film 56 is flat. When the contactor is heated from the normal temperature to a high temperature of approximately 125° C., each of the particles 52 expands largely to increase the volume of the conductive liquid 54 as shown in FIG. 17B, and as a result, the conductive portion 56a of the film 56 protrudes. Accordingly, when aligning the conductive portion 56a with, for example, a terminal of a semiconductor device, at a normal temperature, and then placing the contactor under a high-temperature condition, the conductive liquid 54 generates a pressure which presses the conductive portion 56a against the terminal. This provides a proper contact pressure. In this case, changing a coefficient of linear expansion or mixing rate of the conductive particle 52 thereof enables adjustment of the contact pressure.

Figures 18A, 18B:
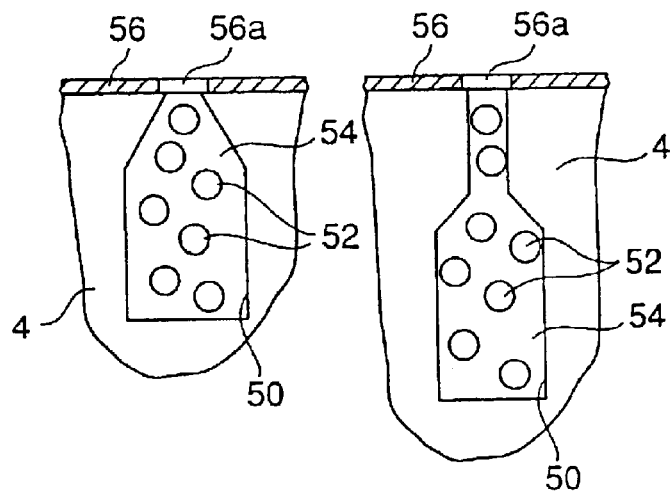
FIG. 18A is a cross-sectional view of a variation of the contact electrode shown in FIG. 17A and FIG. 17B.
FIG. 18B is a cross-sectional view of another variation of the contact electrode shown in FIG. 17A and FIG. 17B.

FIG. 18A and FIG. 18B are cross-sectional views of variations of the contact electrode comprising the conductive liquid mixed with the particles having a large coefficient of linear expansion. As shown in FIG. 18A, a part near the opening of the hole 50 may be tapered toward one end at the surface of the insulating substrate 4 so that the film 56 protrudes more by the elevation of the temperature. Also, as shown in FIG. 18B, the part near the opening of the hole 50 may be narrowed so that the film 56 protrudes even further.

Figure 19:
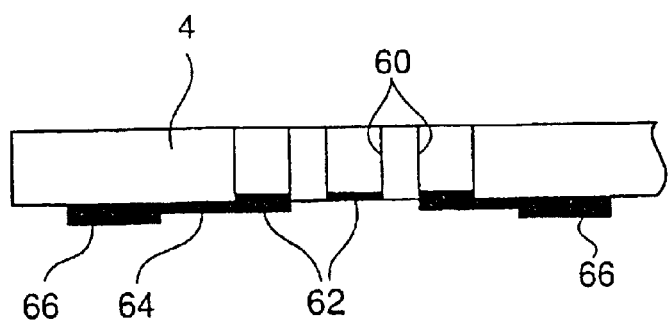
FIG. 19 is an illustration of relocation of an external connection terminal using a wiring pattern.

In the contactor according to each of the above-mentioned embodiments, in a case of forming the contact electrode using a hole closed on one end, a through hole 60 shown in FIG. 19 may be formed in the insulating substrate 4 first, and then closed on the end with a conductive material. In this case, the conductive material functions as an external connection terminal 62 of the contactor. Also, as shown in FIG. 19, the external connection terminal 62 may be connected to a terminal 66 formed at a different location by a wiring pattern 64 so as to relocate the external connection terminal. This provides an increased degree of freedom in arranging the external connection terminal of the contactor, and helps standardize the arrangement of the external connection terminal. It should be noted that the contact electrode according to each of the above-mentioned embodiments is formed in the through hole 60.

Figure 20:
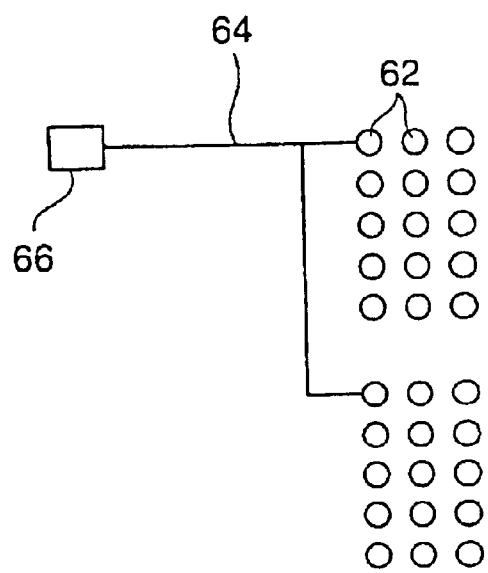
FIG. 20 is an illustration where a wiring of terminals can be made common using the wiring pattern.

Additionally, as shown in FIG. 20, a wiring of terminals can be made common using the wiring pattern 64, which is advantageous in an LSI test or operation, so as to reduce a number of the external connection terminals of the contactor.

Figure 21:
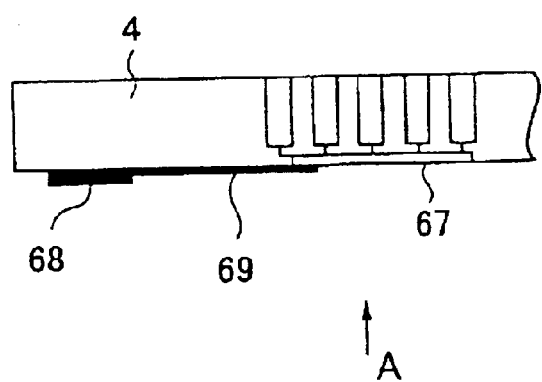
FIG. 21 is an illustration of an example where an auxiliary LSI circuit is formed on the backside of an insulating substrate.
Figure 22:
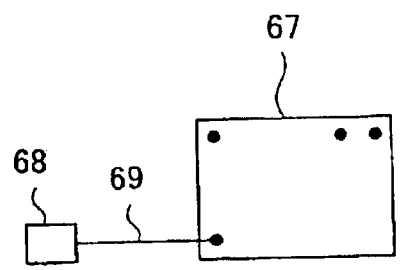
FIG. 22 is another view of the example shown in FIG. 21, the view seen from a viewpoint indicated by an arrow A in FIG. 21.

FIG. 21 is an illustration of an example where an auxiliary LSI circuit 67 is formed on the backside of the insulating substrate 4 formed of a silicon wafer. The auxiliary LSI circuit 67 assists a circuit which conducts a testing operation. This structure provides advantages, such as increased measurement accuracy and a decreased number of channels, so as to reduce a burden of an LSI testing device. FIG. 22 is another view of the example seen from the viewpoint indicated by an arrow A in FIG. 21. A terminal of the auxiliary LSI circuit 67 is connected to an external connection terminal 68 of the contactor by a wiring pattern 69.

Figure 23:
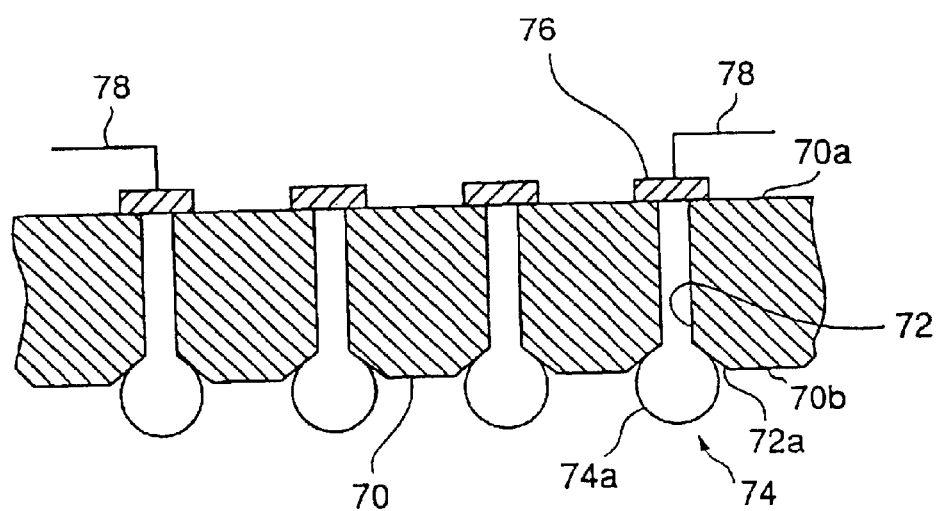
FIG. 23 is a cross-sectional view of a part of a contactor according to a seventh embodiment of the present invention.
Figure 24:
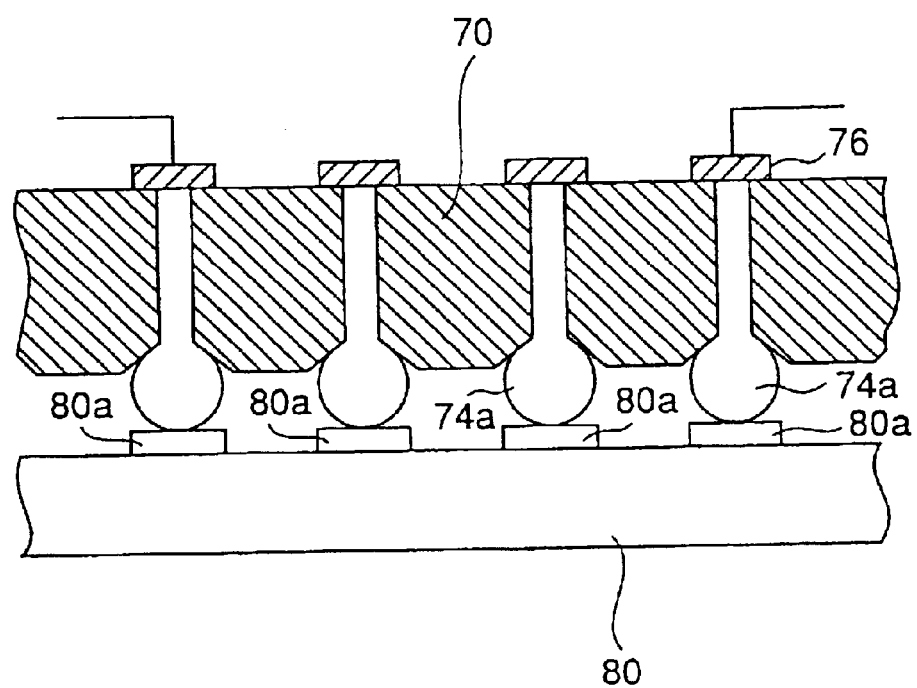
FIG. 24 is a cross-sectional view of the contactor according to the seventh embodiment, the contactor contacting a semiconductor device.

Next, a description will be given, with reference to FIG. 23 and FIG. 24, of a seventh embodiment according to the present invention. FIG. 23 is a cross-sectional view of a part of a contactor according to the seventh embodiment of the present invention. FIG. 24 is a cross-sectional view of the contactor according to the seventh embodiment contacting a semiconductor device.

As shown in FIG. 23, the contactor according to the present embodiment comprises an insulating substrate 70, a multitude of through holes 72 formed therein and a conductor 74 disposed in each of the through holes 72. A terminal 76 for circuit wiring is formed on one surface (upper surface) 70a of the insulating substrate 70 so as to cover and close each of the through holes 72. A lead 78 is connected to the terminal 76 so as to act as a circuit wiring to connect the terminal 76 to a test board. Alternatively, the terminal 76 may be connected to other terminals and the like through a wiring pattern (not shown in the figure) formed on the upper surface 70a of the insulating substrate 70.

According to the present embodiment, a contact electrode comprises the through hole 72 and the conductor 74. It is preferred that an aspect ratio (length to diameter) of the through hole 72 be large. It is also preferred that a counterbore 72a be formed around an opening of the through hole 72 on the end to an under surface 70b of the insulating substrate 70.

The through hole 72 is filled up with the conductor 74. One end of the conductor 74 contacts the terminal 76. The other end of the conductor 74 is formed into a bump portion 74a. The bump portion 74a is substantially spherical and larger in diameter than the through hole 72.

Materials having electric conductivity and very small elasticity are used as a material of the conductor 74. Such materials include liquid metals having a strong surface tension, semi-molten metals, organic conductive materials and conductive materials having a small Young's modulus. At a temperature at which a test using the contactor is performed, these materials or metals become liquefied and conductive or become semi-molten in between a solid phase and a liquid phase. Such materials or metals include:

a) gallium (Ga), a semi-molten metal which is substantially a liquid at normal temperature (melting point: 29.8° C.);

b) an alloy containing 92% gallium (Ga) and 8% tin (Sn) (in a liquid phase at 20° C.);

c) mercury (Hg) (in a liquid phase at normal temperature);

d) an alloy containing mercury; and e) a low-melting-point solder, such as SN-58Bi (melting point: 130° C.), SN-57Bi—Ag (melting point: 137° C.) or SN-57Bi—Ag (melting point: 139° C.)

The through hole 72 is filled up with the conductor 74 in a liquid phase. Accordingly, a portion overflowed from the through hole 72 becomes a hemisphere by its own surface tension and protrudes from the under surface 70b of the insulating substrate 70. The above-mentioned bump portion 74a corresponds to this hemisphere portion.

FIG. 24 is a cross-sectional view of the contactor shown in FIG. 23 contacting a wafer 80 having a semiconductor device formed therein. In bringing the contactor into contact with the wafer, the bump portion 74a of the conductor 74, or the contact electrode, is directed downward and is opposed to an electrode 80a of the semiconductor device formed in the wafer 80 to be tested. Then, the contactor is brought closer to the wafer 80. As soon as a tip of the bump portion 74a of the conductor 74 touches the electrode 80a, the conductor 74 starts to deform.

In a case where the bump portions 74a have different heights, the highest bump portion 74a first touches the corresponding electrode 80a. Subsequently, while the contactor is brought further closer to the wafer 80, each of the bump portions 74a touches the corresponding electrode 80a in the order of height. During this course, the first bump portion 74a to touch the electrode 80a deforms easily, and while the contactor is brought further closer to the wafer 80, provides a substantially constant contact pressure. This is because, since the conductor 74 comprising the bump portion 74a is in a liquid phase or semi-molten, the bump portion 74a can deform easily toward a peripheral space thereof. Also, since an aspect ratio of the through hole 72 is supposed to be relatively large, the conductor 74 can undergo elastic deformation in a longitudinal direction of the through hole 72, contributing to keeping the contact pressure from increasing.

A photo-excited electrolytic grinding method can be used to form the through hole 72 having a large aspect ratio in the insulating substrate 70 formed of a silicon wafer, for example. The through hole 72 can be formed at a low cost by this method. A liquid suction method can be used to fill the through hole 72 with the conductor 74. That is, the under surface 70b of the insulating substrate 70 having the through hole 72 formed therein is immersed in a conductive material in a liquid phase. Then, the conductive material in a liquid phase is sucked from the upper surface 70a through the through hole 72. The through hole 72 having a diminutive diameter can be easily filled with the conductive material in a liquid phase by this method.

As mentioned above, the conductor 74 is used as a contact electrode either in a liquid phase or in a semi-molten state in between a solid phase and a liquid phase. Conductive materials in the semi-molten state in between a solid phase and a liquid phase include mercury (Hg) and gallium (Ga). Also, a mixture of an organic material and a metal is usable.

Although the conductor in the semi-molten state in between a solid phase and a liquid phase has elasticity, a spring constant thereof is very small. Therefore, when the conductor in the semi-molten state is pressed against an electrode of an object to be tested, a contact pressure can be kept near to zero. Additionally, the larger the aspect ratio of the through hole is, the easier it is for the conductor to undergo elastic deformation in the through hole. Accordingly, the larger the aspect ratio of the through hole is, the lower the contact pressure can be kept, when the conductor is brought closer to the electrode.

In addition, a material having high wettability to the conductor 74 may be formed on an inner surface of the through hole 72 so that, when the conductor 74 becomes semi-molten in between a solid phase and a liquid phase, the conductor 74 adheres to the inner surface of the through hole 72 and is held surely in the through hole 72.

Next, a description will be given of examples of the contactor according to the seventh embodiment.

EXAMPLE 1

The contactor according to the present embodiment was used as a contactor for a CSP (LGA type) in the form of a wafer. The CSP had pad terminals (electrodes) with a 500-$\mu$m pitch. Each of LSI circuits to be tested was a 10-mm-square LSI chip and had 360 terminals in a full matrix. The LSI chip had been formed in an 8-inch wafer. The wafer had approximately 250 LSI chips and 90,000 terminals in total.

A 500-$\mu$m-thick silicon wafer was used as the insulating substrate 70 of the contactor. The through holes 72, each having a diameter of 150 $\mu$m, were formed in this silicon wafer with a 500-$\mu$m pitch by a photo-excited electrolytic grinding method. The terminal 76 for circuit wiring was formed on one end of each of the through holes 72. The counterbore 72a was formed on the other end. Each of the through holes 72 was filled with the above-mentioned conductor by a liquid suction method.

The above-mentioned CSP in the form of a wafer was brought closer to the contactor prepared as above so that the terminals of the CSP touched the corresponding contact electrodes (the bump portions of the conductor) of the contactor. Until all of the terminals of the CSP contacted the corresponding conductors of the contactor, substantially no pressure was required on the contactor. A very small average pressure of 0.05 g or less a terminal was enough to bring all of the terminals of the CSP into contact with the corresponding conductors of the contactor.

In the above-mentioned state of contact, by connecting the external connection terminals 76 of the contactor to a test board through the leads 78, a functional test and a burn-in test were able to be conducted in the form of wafer. Each of the conductors was in a liquid phase or semi-molten and thus was not bonded to the electrode of the LSI chip. Therefore, after the test, the bump portion of the conductor was easily detached from the electrode of the LSI chip, and the contactor was able to be used in another test.

EXAMPLE 2

A contactor for testing the same CSP in the form of a wafer as the above-mentioned Example 1 was formed using SN-58Bi, which is a low-meltingpoint solder, as the conductor.

First, registration was performed between the contactor and the LSI chips in the wafer at a normal temperature. Thereafter, the contactor and the wafer were heated to 125° C. so that the conductors became semi-molten. Then, the bump portions of the conductors were bonded to the terminals of the LSI chips with a load of 1 g a terminal by thermo-compression bonding, successfully with an excellent contact.

In the present example, after the bump portions of the conductors were bonded to the terminals of the LSI chips, the contactor and the wafer were mounted on a prober, which was a test device. Then, the prober was connected to the terminals for circuit wiring formed on the insulating substrate of the contactor so as to carry out a functional test. Further, after the functional test, the contactor and the wafer were transferred to a burn-in board to perform a burn-in test.

Thereafter, the contactor and the wafer were again transferred to the prober to carry out functional tests of LSI chips at normal and high temperatures. Finally, by heating the contactor and the wafer to a proper temperature, the bump portions of the conductors were easily detached from the terminals of the LSI chips.

EXAMPLE 3

A contactor having the same structure as the above-mentioned Example 1, except for a low-melting-point solder used as the conductor, was prepared. After the contactor was heated to 150° C. so that the solder became molten, the contactor was brought into contact with the wafer with a load of zero. This contact was performed in a nitrogen atmosphere to avoid forming an oxide film on a surface of the solder. Then, a temperature cycling test was carried out at temperatures from −25° C. to 125° C., providing the same result as a conventional method.

EXAMPLE 4

The insulating substrate 70 of the contactor was formed of silicon (Si). Each of the holes was filled with a metal, as the conductor 74, which metal is softer than silicon and has little tendency to form an alloy together with a metal forming the terminal of the LSI circuit to be tested.

This structure allows for easy detachment of the contact electrode from the terminal of the LSI circuit. Therefore, a contactor could be prepared exclusively for each of test steps, such as a final test and a burn-in test. That is, a contactor was provided exclusively for each of test devices, and after completion of each of the test steps, only the LSI circuits could be transferred.

EXAMPLE 5

In the above-mentioned example 1, the terminals were formed with a 500-$\mu$m pitch. However, in the present example, a contactor for testing an area-array type semiconductor device having terminals mounted with a 200-$\mu$m pitch by flip chip bonding was formed. The insulating substrate 70 was formed of silicon. Each of the holes was formed 50 $\mu$m in diameter and 200 $\mu$m in depth.

The following were used as a material forming the conductor:

a) gallium (Ga), a semi-molten metal which is substantially a liquid at normal temperature (melting point: 29.8° C.);

b) an alloy containing 92% gallium (Ga) and 8% tin (Sn) (in a liquid phase at 20° C.);

c) mercury (Hg) (in a liquid phase at normal temperature); or d) an alloy containing mercury.

The contactor prepared as above was brought into contact with the above-mentioned area-array type semiconductor device. It was proved that, even when the semiconductor device was in the form of a wafer, approximately 1 kg of pressure as a whole was able to provide a uniform contact.

The present invention is not limited to the specifically disclosed embodiments, and variations and modifications may be made without departing from the scope of the present invention.

The present application is based on Japanese priority application No.2000-191405 filed on Jun. 26, 2000, the entire contents of which are hereby incorporated by reference.

What is claimed is:

1. A contactor comprising:

an insulating substrate;

a concave portion formed in said insulating substrate and extending in a perpendicular direction from a surface thereof;

a conductive liquid filling said concave portion; and a conductive particle disposed in said concave portion and having a specific gravity different from a specific gravity of said conductive liquid, wherein a difference between said specific gravity of said conductive particle and said specific gravity of said conductive liquid causes a part of said conductive particle to protrude from a surface of said insulating substrate.

2. The contactor as claimed in claim 1, wherein said specific gravity of said conductive particle is smaller than said specific gravity of said conductive liquid so that a buoyancy acting on said conductive particle causes the conductive particle to protrude from said insulating substrate.

3. The contactor as claimed in claim 1, wherein said specific gravity of said conductive particle is higher than said specific gravity of said conductive liquid so that a gravity force acting on said conductive particle causes the conductive particle to protrude from said insulating substrate.

4. The contactor as claimed in claim 1, wherein said concave portion is formed as a through hole penetrating through said insulating substrate in said perpendicular direction, and a terminal for circuit wiring closes one end of said through hole.

5. The contactor as claimed in claim 1, wherein a liquid storing portion is formed on a surface end of said concave portion, the liquid storing portion having a diameter larger than a diameter of a bottom of said concave portion, and when said conductive particle is pressed into said conductive liquid, said conductive liquid flows into said liquid storing portion so that said conductive liquid does not spill from said concave portion.

6. The contactor as claimed in claim 1, wherein an insulating film is formed on the surface of said insulating substrate; an opening is formed at a position in said insulating film corresponding to one end of said concave portion, the opening having a diameter smaller than a diameter of said conductive particle; and a part of said conductive particle protrudes from said opening.

* * * * *